(12) United States Patent
Wu et al.

(10) Patent No.: US 10,891,082 B2
(45) Date of Patent: Jan. 12, 2021

(54) METHODS FOR ACCELERATING COMPRESSION AND APPARATUSES USING THE SAME

(71) Applicant: Shanghai Zhaoxin Semiconductor Co., Ltd., Shanghai (CN)

(72) Inventors: Fangfang Wu, Beijing (CN); Shican Luo, Beijing (CN); Xiaoyang Li, Beijing (CN); Jin Yu, Shanghai (CN); Lei Meng, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 297 days.

(21) Appl. No.: 15/797,423

(22) Filed: Oct. 30, 2017

(65) Prior Publication Data

US 2019/0004738 A1  Jan. 3, 2019

(30) Foreign Application Priority Data

Jun. 28, 2017  (CN) .......................... 2017 1 0506637

(51) Int. Cl.
*G06F 3/06* (2006.01)
*G06F 12/02* (2006.01)
*H03M 7/30* (2006.01)

(52) U.S. Cl.
CPC .......... *G06F 3/0661* (2013.01); *G06F 3/0608* (2013.01); *G06F 3/0656* (2013.01); *G06F 3/0673* (2013.01); *G06F 12/02* (2013.01); *H03M 7/30* (2013.01); *H03M 7/3084* (2013.01)

(58) Field of Classification Search
CPC ...... G06F 3/0661; G06F 12/02; G06F 3/0608; G06F 3/0656; G06F 3/0673; H03M 7/30; H03M 7/3084
See application file for complete search history.

(56) References Cited

U.S. PATENT DOCUMENTS

| | | | |
|---|---|---|---|
| 9,979,414 B1* | 5/2018 | Li | .......................... G06F 3/0613 |
| 2003/0028673 A1* | 2/2003 | Lin | ..................... H04L 67/2823 |
| | | | 709/247 |
| 2015/0295729 A1* | 10/2015 | Bevinamarad | ...... H04L 12/4633 |
| | | | 370/474 |

* cited by examiner

*Primary Examiner* — David Yi
*Assistant Examiner* — Alan Otto
(74) *Attorney, Agent, or Firm* — McClure, Qualey & Rodack, LLP

(57) ABSTRACT

The invention introduces a method for accelerating compression, performed by configuration logic of a compression accelerator, containing: obtaining an input parameter from a processor core; obtaining a configuration setting from a compression parameter table according to the input parameter; configuring hardware coupled between a first buffer and a second buffer to form a data transmission path according to the input parameter, wherein the first buffer stores raw data; and transmitting the configuration setting to devices on the data transmission path for processing the raw data to generate compressed data and storing the compressed data in the second buffer.

19 Claims, 5 Drawing Sheets

METHODS FOR ACCELERATING COMPRESSION AND APPARATUSES USING THE SAME

CROSS REFERENCE TO RELATED APPLICATIONS

This application claims the benefit of China Patent Application No. 201710506637.1, filed on Jun. 28, 2017, the entirety of which is incorporated by reference herein.

BACKGROUND

Technical Field

The present invention relates to a microprocessor, and in particular, to methods for accelerating compression and apparatuses using the same.

Description of the Related Art

String matching methods can be categorized into those that are CAM (Content addressable Memory) -based and those that are hash-based. The aforementioned string matching usually needs optimized LSM (Longest-prefix String Matching) methods, whose optimization may be realized in the software domain. The performance of software is typically worse than that of dedicated hardware. Different types of compression hardware are typically needed to compress a string into the designated format, which may be ZLIB, GZIP, LZS, LZ4, LZO, etc., however, resulting in a microprocessor with bigger chip size. Therefore, what are needed are methods for accelerating compression performed in dedicated hardware and apparatuses using the same to overcome the aforementioned drawbacks.

BRIEF SUMMARY

An embodiment of the invention introduces a method for accelerating compression, performed by a configuration logic of a compression accelerator, at least containing: obtaining an input parameter from a processor core; obtaining a configuration setting from a compression parameter table according to the input parameter; configuring hardware coupled between a first buffer and a second buffer to form a data transmission path according to the input parameter, wherein the first buffer stores raw data; and transmitting the configuration setting to devices on the data transmission path for processing the raw data to generate compressed data and storing the compressed data in the second buffer.

An embodiment of the invention introduces an apparatus for accelerating compression, at least containing: a first buffer; a second buffer; and a configuration logic. The configuration logic obtains an input parameter from a processor core; obtains a configuration setting from a compression parameter table according to the input parameter; configures hardware coupled between the first buffer and the second buffer to form a data transmission path according to the input parameter, wherein the first buffer stores raw data; and transmits the configuration setting to devices on the data transmission path for processing the raw data to generate compressed data and storing the compressed data in the second buffer.

With the aforementioned methods and apparatuses for accelerating compression illustrated in the invention, compression algorithms of different types can reuse at least portions of the hardware to compress the raw data of the first buffer, instead of providing multiple compression accelerators for different algorithm types, resulting in a smaller microprocessor.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
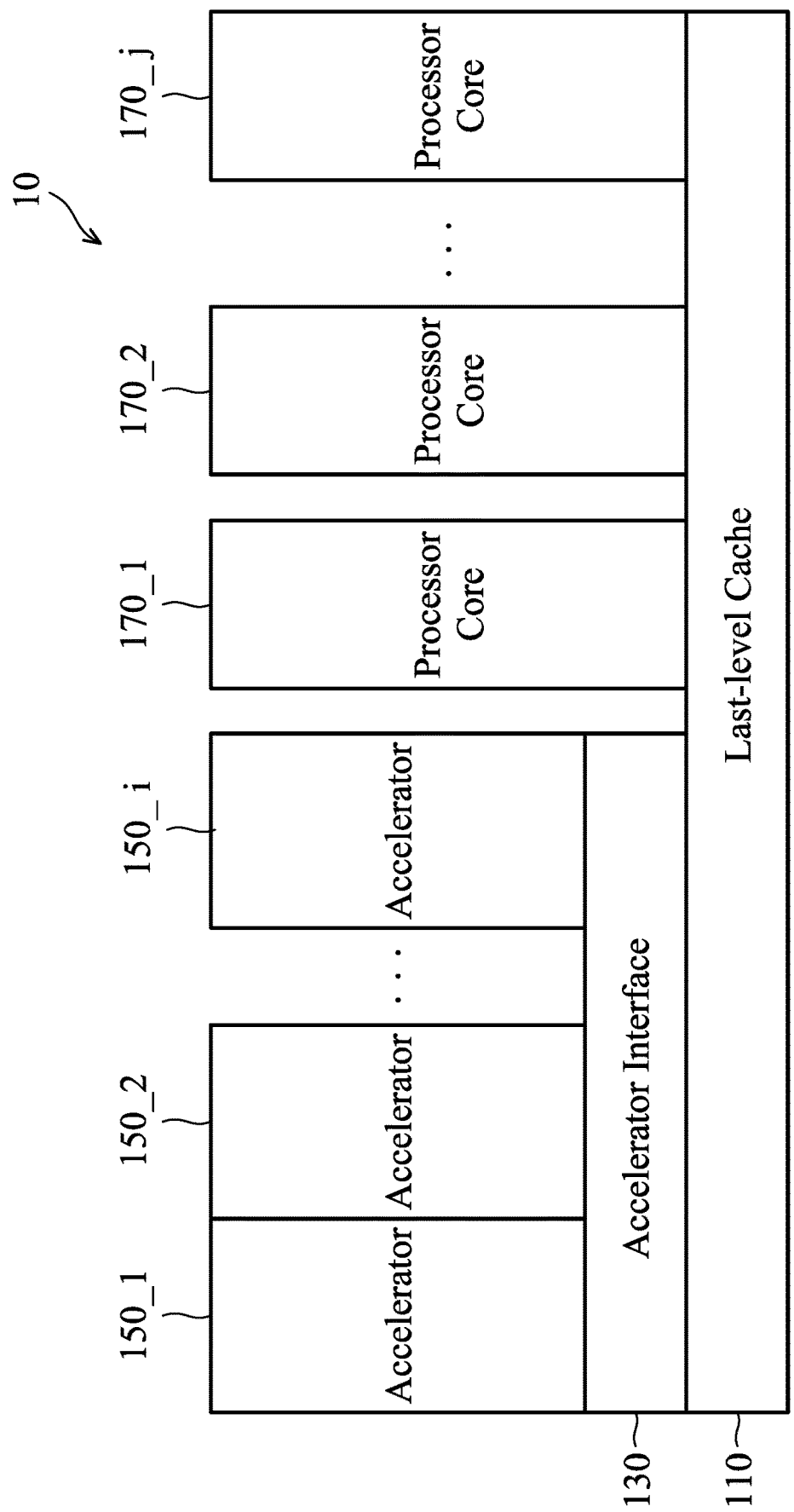
FIG. 1 is a system diagram of a microprocessor according to an embodiment of the invention.

FIG. 1 is a system diagram of a microprocessor according to an embodiment of the invention. A microprocessor 10 may contain processor cores 170_1 to 170_j and accelerators 150_1 to 150_i, where i and j are integers and may be set depending on different design requirements. The accelerators 150_1 to 150_i, for example, may be AFUs (Accelerator Functional Units). Components of any of the processor cores 170_1 to 170_j participate in the execution of computer instructions, such as an ALU (Arithmetic Logic Unit), a FPU (Floating Point Unit), a L1 cache and a L2 cache. An instruction cycle (sometimes called a fetch—decode—execute cycle) being the basic operational process is employed in each processor core. It is the process by which a processor core retrieves a program instruction from its memory, determines what operation the instruction indicates, and executes those operations. The accelerators 150_1 to 150_i may perform different functions and connect to a last-level cache 110 via an accelerator interface 130 to exchange data with the processor cores 170_1 to 170_*j* using virtual addresses. Any of the accelerators 150_1 to 150_*i* assists the processor cores 170_1 and 170_*j* to perform designated functions with heavy computation loading more efficiently, such as compression, ciphering/deciphering, regular matching or the like, thereby reducing the workload on the processor cores 170_1 to 170_*j*. One of the accelerators 150_1 to 150_*i* is a compression accelerator to complete a string compression.

Figure 2:
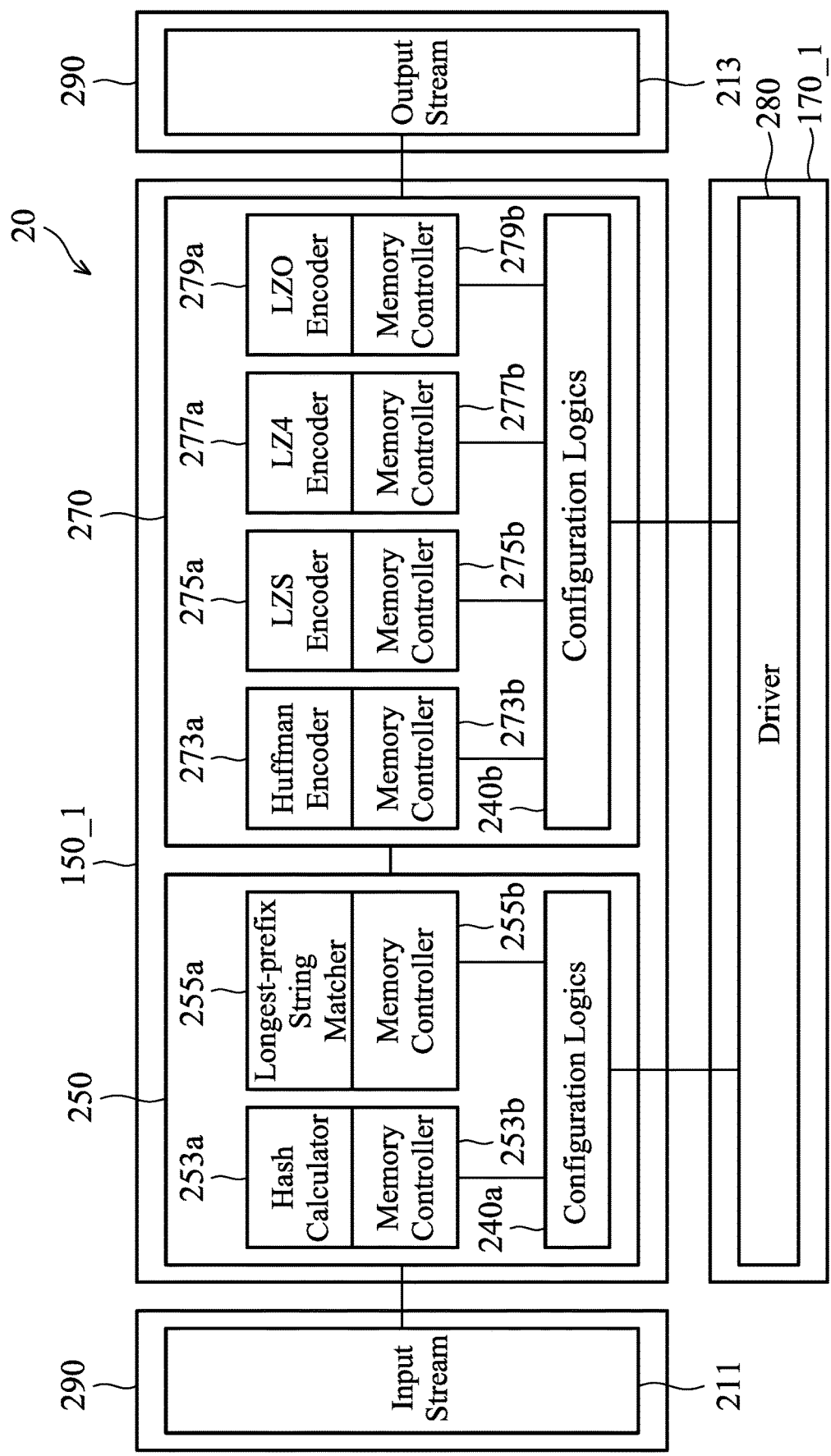
FIG. 2 is a block diagram of a compression acceleration system according to an embodiment of the invention.

FIG. 2 is a block diagram of a compression acceleration system according to an embodiment of the invention. A compression accelerator 20 contains a data register 290 for storing an input stream 211 and an output stream 213. For example, the compression acceleration system 20 additionally contains the processor core 170_1 and the accelerator 150_1 and the accelerator 150_1 is the compression accelerator for compressing the input raw stream 211 into the output stream 213. In compression, the compression acceleration system 20 supports a wide range of compression calculators and encoders realized in hardware circuits and selects one needed compression calculator and encoder according to an input parameter for compressing the input raw stream 211 to generate the output stream 213 conforming to a designated algorithm type. The accelerator 150_1 contains a compression device 250 and an encoding device 270. The input stream 211 is transmitted to the compression device 250 first. The compression device 250 contains a hash calculator 253*a* and a longest-prefix string matcher 255*a*. The hash calculator 253*a* may perform all hash computations supporting a wide range of formats, such as GIP, ZLIB, LZS, LZ4, or others. The hash calculator 253*a* may access data (such as, variables, compared strings, hash tables, etc.) needed in a hash computation from a memory via a memory controller 253*b*. The longest-prefix string matcher 255*a* may access data (such as, variables, compared strings, etc.) needed in a longest-prefix string matching from a memory via a memory controller 255*b*. The encoding device 270 may contain a Huffman encoder 273*a*, a LZS encoder 275*a*, a LZ4 encoder 277*a*, a LZO encoder 279*a* that access data (such as, variables, mapping tables, etc.) needed for encoding a string into a designated output format from a memory via the memory controller 273*b*, 275*b*, 277*b* and 279*b*, respectively.

A configuration logic 240*a* is coupled to the compression device 250, the encoding device 270 and the processor core 170_1. When loading and executing a driver 280, the processor core 170_1 drives the configuration logic 240*a* to transmit the input stream 211 to a designated calculator of the hash calculator 253*a* for completing designated hash computations. Subsequently, the longest-prefix string matcher 255*a* receives hash results and performs a string matching using a longest-prefix string searching method. A configuration logic 240*b* are coupled to the Huffman encoder 273*a*, the LZS encoder 275*a*, the LZ4 encoder 277*a*, the LZO encoder 279*a* and the processor core 170_1. When the algorithm type is ZLIB or GZIP, the executed driver 280 drives the configuration logic 240*b* to transmit the hash results and the string matching results to the Huffman encoder 273*a* for encoding the input stream 211 into the output stream 213 in ZLIB or GZIP format. When the algorithm type is LZS, LZ4 or LZO, the executed driver 280 drives the configuration logic 240*b* to transmit the hash results and the string matching results to the corresponding encoder (which is one of the following: LZS encoder 275*a*, LZ4 encoder 277*a* and LZO encoder 279*a*) for encoding the input stream 211 into the output stream 213 in the corresponding format (LZS, LZ4, or LZO).

Figure 3:
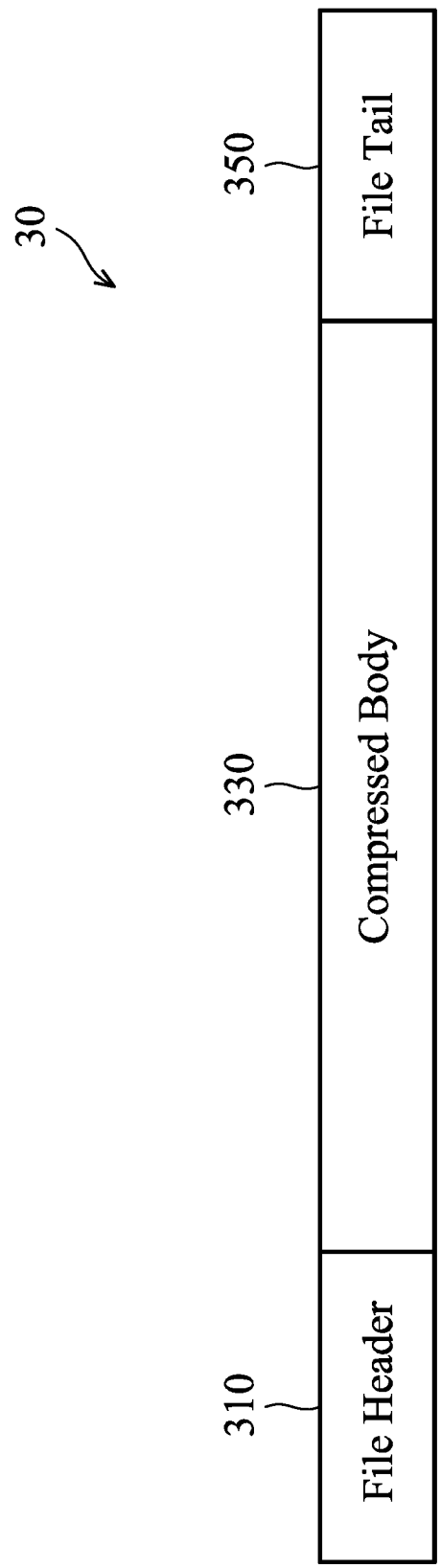
FIG. 3 is a schematic diagram of the format of a compressed file according to an embodiment of the invention.

FIG. 3 is a schematic diagram of the format of a compressed file according to an embodiment of the invention. A compressed file 30 may contain a file header 310, a compressed body 330 and a file tail 350. The processor core 170_1 when executing relevant program code generates the file header 310 and the file tail 350, and directs the compression accelerator 150_1 taught by the invention to generate the compressed body 330. In addition, the processor core 170_1 generates a file containing the file header 310, the compressed body 330 and the file tail 350 and directs designated interface to store the file in a nonvolatile storage device, such as a hard drive, a flash memory, a SSD (Solid State Disk), etc., or directs a communications module to transmit the file to remote electronic equipment.

Figure 4:
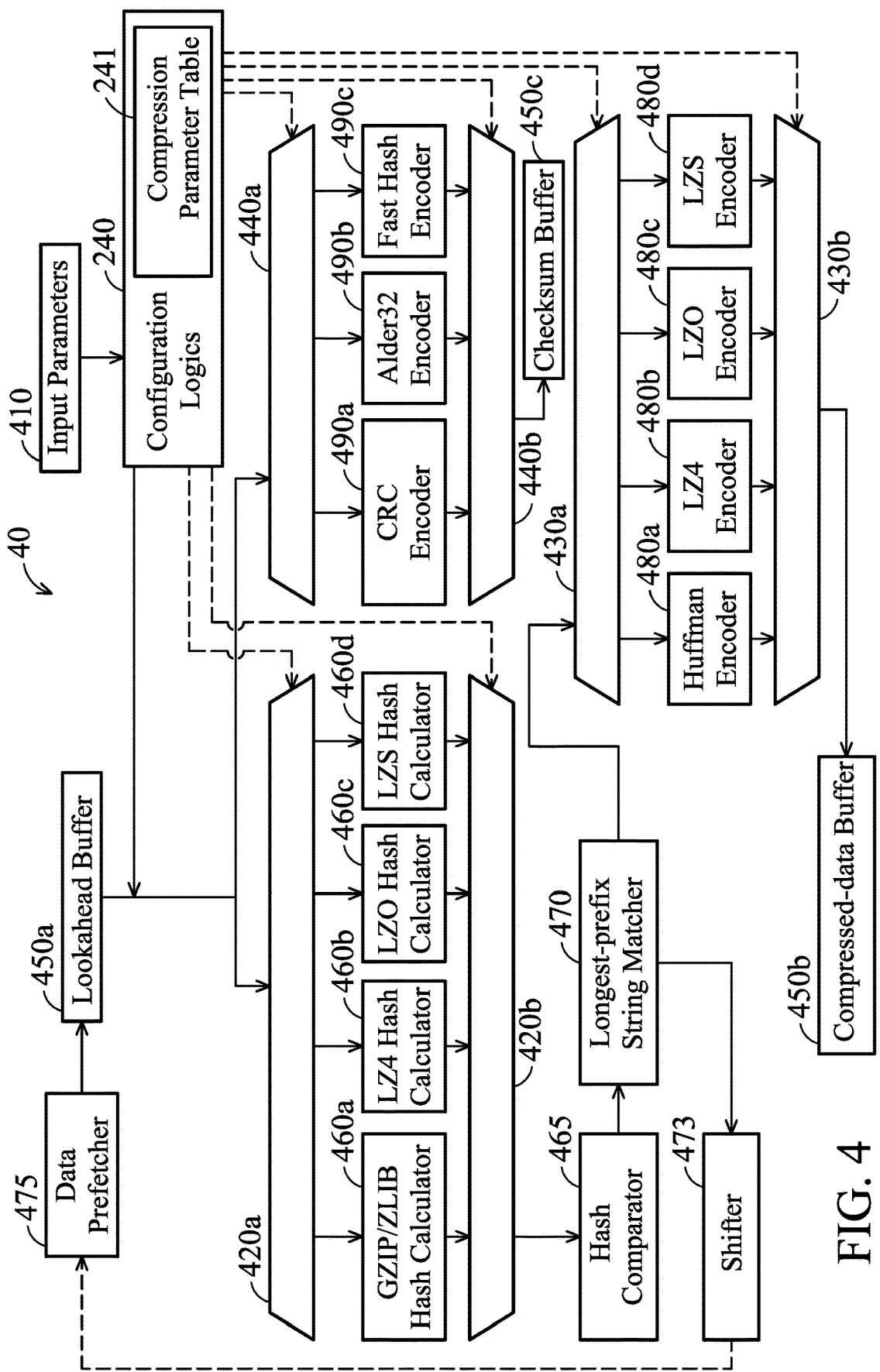
FIG. 4 is the hardware block diagram of a compression accelerator according to an embodiment of the invention.

FIG. 4 is the hardware block diagram of a compression accelerator according to an embodiment of the invention. Since portions of the hardware of compression algorithms in different formats can be reused, a compression accelerator 40 may install configuration logic 240 to configure relevant hardware to form a data transmission path for transmitting strings to a calculator or an encoder associated with a specified format by controlling MUXs (multiplexers) and DEMUXs (de-multiplexers), thereby enabling the raw string can be processed by the designated calculator or encoder. The configuration logic 240 can be realized by fixed functions implemented in PLD (Programmable Logic Device), PLC (Programmable Logic Controller), FPGA (Field Programmable Gate Array) or ASIC (Application-Specific Integrated Circuit) for performing controls described in the embodiments of the invention. The configuration logic 240 store a compression parameter table 241 for recording configuration settings and each configuration setting is associated with a specified algorithm type and a compression level (in option). The compression parameter table 241 may be stored in a cache, a SRAM (Static Random Access Memory), a ROM (Read Only Memory) or an EPROM (Erasable Programmable Read Only Memory). The exemplary compression parameter table 241 is illustrated in Table 1 as follows:

TABLE 1

| Algorithm Type | Compression Level | Dict. Size | Hash Table Size | Output Format | Min-Matched length | Max-Matched length | Hash algorithm |
|---|---|---|---|---|---|---|---|
| GZIP/ZLIB | 1 | WS0 | TS0 | O0 | Min0 | Max0 | H0 |
| GZIP/ZLIB | 2 | WS0 | TS0 | O0 | Min0 | Max0 | H0 |
| GZIP/ZLIB | 3 | WS0 | TS0 | O0 | Min0 | Max0 | H0 |
| GZIP/ZLIB | 4 | WS0 | TS0 | O0 | Min0 | Max0 | H0 |
| GZIP/ZLIB | 5 | WS0 | TS0 | O0 | Min0 | Max0 | H0 |
| GZIP/ZLIB | 6 | WS0 | TS0 | O0 | Min0 | Max0 | H0 |
| GZIP/ZLIB | 7 | WS0 | TS0 | O0 | Min0 | Max0 | H0 |
| GZIP/ZLIB | 8 | WS0 | TS0 | O0 | Min0 | Max0 | H0 |

TABLE 1-continued

| Algorithm Type | Compression Level | Dict. Size | Hash Table Size | Output Format | Min-Matched length | Max-Matched length | Hash algorithm |
|---|---|---|---|---|---|---|---|
| GZIP/ZLIB | 9 | WS0 | TS0 | O0 | Min0 | Max0 | H0 |
| LZ4 | 1 | WS1 | TS1 | O1 | Min1 | Max1 | H1 |
| LZ4 | 2 | WS1 | TS1 | O1 | Min1 | Max1 | H1 |
| LZ4 | 3 | WS1 | TS1 | O1 | Min1 | Max1 | H2 |
| LZ4 | 4 | WS1 | TS1 | O1 | Min1 | Max1 | H2 |
| LZ4 | 5 | WS1 | TS1 | O1 | Min1 | Max1 | H2 |
| LZ4 | 6 | WS1 | TS1 | O1 | Min1 | Max1 | H2 |
| LZ4 | 7 | WS1 | TS1 | O1 | Min1 | Max1 | H2 |
| LZ4 | 8 | WS1 | TS1 | O1 | Min1 | Max1 | H2 |
| LZ4 | 9 | WS1 | TS1 | O1 | Min1 | Max1 | H2 |
| LZO | Null | WS2 | TS2 | O2 | Min2 | Max2 | H3 |
| LZS | Null | WS3 | TS3 | O3 | Min3 | Max3 | H4 |

The compression parameter table 241 may contain 20 records and each record contains data of a predefined length. Although the embodiments have been described having a specific number of records for specific algorithm types, such as 20 records for GZIP, ZLIB, LZ4, LZO and LZS, it is noted that these are merely the exemplary features, and the invention is equally applicable to systems having more or less number of records for other algorithm types. Each record stores configuration settings associated with an algorithm type, or an algorithm type with a compression level, such as information indicating a dictionary size, a hash table size, an output format, a minimum-matched length, a maximum-matched length, a checksum type, a hash algorithm, or others. "GZIP/ZLIB" is a predefined constant indicating that the algorithm type is GZIP or ZLIB. "LZ4" is a predefined constant indicating that the algorithm type is LZ4. "LZO" is a predefined constant indicating that the algorithm type is LZO. "LZS" is a predefined constant indicating that the algorithm type is LZS. "WS0", "WS1", "WS2" and "WS3" are constants indicating different dictionary sizes, for example, 16K, 32K, 48K, 64K, etc. "TS0", "TS1", "TS2" and "TS3" are constants indicating different hash table sizes, for example, 16K, 32K, 64K, 128K, etc. "O0" and "O1" are constants indicating different output formats, such as Deflate, Frame format, LZO1x-1, etc. "Min0", "Min1", "Min2" and "Min3" are constants indicating different minimum-matched lengths, for example, 2, 3, 4, etc. "Max0", "Max1", "Max2" and "Max3" are constants indicating different maximum-matched lengths, for example, 128, 256, etc. "H0", "H1", "H2" and "H3" are constants indicating different hash algorithms, for example, Deflate hash, LZ4 hash of different levels, LZO1x-1 hash, etc. The processor core 170_1 may transmit input parameters 410 to the compressor accelerator 150_1, in which contain an algorithm type, a compression level and a checksum type, for instructing the compression accelerator 150_1 to compress the input stream 211 into the output stream 213 in a particular format (that is, the compressed body 330 as shown in FIG. 3). It should be understood that, when the processor core 170_1 compresses strings and generates the compressed file 30 as shown in FIG. 3, the input parameters 410 that will be used to decompress the compressed file 30 are added into the file header 310. The configuration logic 240 may control the MUXs 420a and 430a and DEMUXs 420b and 430b to form a data path, thereby enabling raw data of the lookahead buffer 450a to be input to a designated hash calculator and a designated compression encoder. The designated hash calculator may be one of a GZIP/ZLIB hash calculator 460a, a LZ4 hash calculator 460b, a LZO hash calculator 460c and a LZS hash calculator 460d. The designated compression encoder may be one of a Huffman encoder 480a, a LZ4 encoder 480b, a LZO encoder 480c, a LZS encoder 480d.

In addition, the configuration logic 240 may calculate a memory address according to the algorithm type or the algorithm type with the compression level of the input parameters 410, read data of the predefined length from the calculated memory address and parse the configuration settings from the data. When the algorithm type of the input parameters 410 is GZIP or ZLIB, with reference made to the compression parameter table 241, the memory address may be calculated using Equation (1) as follows:

$$\text{Addr} = T_{start} + (\text{Lvl}-1) * \text{Len} \qquad (1).$$

When the algorithm type of the input parameters 410 is LZ4, the memory address may be calculated using Equation (2) as follows:

$$\text{Addr} = T_{start} + (C1 + \text{Lvl}-1) * \text{Len} \qquad (2).$$

When the algorithm type of the input parameters 410 is LZO, the memory address may be calculated using Equation (3) as follows:

$$\text{Addr} = T_{start} + (C1 + C2) * \text{Len} \qquad (3).$$

When the algorithm type of the input parameters 410 is LZS, the memory address may be calculated using Equation (4) as follows:

$$\text{Addr} = T_{start} + (C1 + C2 + 1) * \text{Len} \qquad (4).$$

Addr indicates the calculated memory address, $T_{start}$ indicates the start address of the compression parameter table 241, Len indicates a length of each record, Lvl indicates the compression level of the input parameters 410, C1 indicates the maximum compression level for the GZIP or ZLIB algorithm type and C2 indicates the maximum compression level for the LZ4 algorithm type. Those skilled in the art may devise the content of the compression parameter table and modify the equations for calculating the memory address to reflect the revised compression parameter table, and the invention should not be limited thereto. Subsequently, the configuration logic 240 transmit the configuration settings to the designated hash calculator, which is one of the hash calculators 460a-460d, a longest-prefix string matcher 470, and the designated compression encoder, which is one of the compression encoders 480a-480d, to enable the designated hash calculator, the longest-prefix string matcher 470 and the designated compression encoder to perform computations according to the configuration settings, thereby allowing the raw data of the lookahead buffer 450a to be encoded into the algorithm type indicated by the input parameters 410. The compressed data may be stored in a compressed-data buffer 450*b* and to be read by the processor core 170_1. The configuration logic 240 may further control the MUXs 440*a* and 440*b* to form a data path according to the checksum type of the input parameters 410, thereby enabling a designated checksum encoder to generate a checksum corresponding to the raw data of the lookahead buffer 450*a*. The designated checksum encoder may be one of a CRC (Cyclic Redundancy Check) encoder 490*a*, Alder32 encoder 490*b* and a fast hash encoder 490*c*.

The following describes a scenario operated by the configuration logic 240 when the algorithm type of the input parameters 410 is GZIP or ZLIB. The configuration logic 240 may control the MUX 420*a* to connect the lookahead buffer 450*a* to the GZIP/ZLIB hash calculator 460*a*, thereby enabling the GZIP/ZLIB hash calculator 460*a* to read and calculate the raw data of the lookahead buffer 450*a*, and control the DEMUX 420*b* to connect the GZIP/ZLIB hash calculator 460*a* to a hash comparator 465, thereby enabling the hash comparator 465 to obtain hash values generated by the GZIP/ZLIB hash calculator 460*a*. Moreover, the configuration logic 240 may control the MUX 430*a* to connect a longest-prefix string matcher 470 to the Huffman encoder 480*a*, thereby enabling the Huffman encoder 480*a* to obtain raw strings or matched offsets with matched lengths output from the longest-prefix string matcher 470 and accordingly encode the raw data of the lookahead buffer 450*a* into compressed data in the GZIP or ZLIB format. Those skilled in the art may realize the Huffman encoder 480*a* for generating compressed data in the GZIP format by referring to DEFLATE compressed data format specification version 1.3 published in May 1996 (namely RFC1951) and GZIP file format specification version 4.3 published in May 1996 (namely RFC1952). In addition, those skilled in the art may realize the Huffman encoder 480*a* for generating compressed data in the ZLIB format by referring to DEFLATE compressed data format specification version 1.3 published in May 1996 (namely RFC1951) and ZLIB compressed data format specification version 3.3 published in May 1996 (namely RFC1950). The configuration logic 240 may transmit the configuration settings that contain, for example, the compression level, the dictionary size "WS0", the hash table size "TS0", the output format "O0", the minimum-matched length "Min0", the maximum-matched length "Max0", the hash algorithm "H0", etc., read from the compression parameter table 241 to the GZIP/ZLIB hash calculator 460*a*, the hash comparator 465, the longest-prefix string matcher 470 and the Huffman encoder 480*a*. The configuration logic 240 may control the MUX 440*a* to connect the lookahead buffer 450*a* to the CRC encoder 490*a* or the Alder32 encoder 490*b* according to the checksum type of the input parameters 410, thereby enabling the connected checksum encoder to generate checksum values according to the raw data of the lookahead buffer 450*a*, and control the DEMUX 440*b* to connect the designated checksum encoder 490*a* or 490*b* to a checksum buffer 450*c* according to the checksum type of the input parameters, thereby enabling the designated checksum 490*a* or 490*b* to store the checksum values in the checksum buffer 450*c*. The checksum values are feedback to the driver 280 through the processor core 170_1. The driver 280 adds the checksum values into the file tail 350. Later on, the compressed body 330 of the compressed file 30 will be decompressed and the same checksum calculation will be performed on the decompressed data to obtain checksum values. It will be determined whether the obtained checksum values corresponding to the decompressed data are the same as that generated in compression (for example, that added in the file tail 350) to know if the compressed file 30 is decompressed correctly. For example, when the input parameters 410 indicate that the algorithm type is GZIP or ZLIB and the compression level is 4, the GZIP/ZLIB hash calculator 460*a* reads the raw data of 3 bytes from the lookahead buffer 450*a* and uses the hash algorithm "H0" on the read data, and the hash comparator 465 traverses and updates a hash table by using the hash values obtained from the GZIP/ZLIB hash calculator 460*a*. Subsequently, the longest-prefix string matcher 470 uses a match algorithm to calculate a longest-match length between raw strings of a sliding window (i.e. a dictionary) and the lookahead buffer 450*a*. If a match is presented, the longest-prefix string matcher 470 outputs a matched offset and a matched length to the Huffman encoder 480*a* and move the sliding window of a data prefetcher 475 forward by the matched length of bytes via a shifter 473. If a match is absent, the longest-prefix string matcher 470 outputs the raw string to the Huffman encoder 480*a* and move the sliding window of the data prefetcher 475 forward by 1 byte via the shifter 473.

The following describes a scenario operated by the configuration logic 240 when the algorithm type of the input parameters 410 is LZ4. The configuration logic 240 may control the MUX 420*a* to connect the lookahead buffer 450*a* to the LZ4 hash calculator 460*b*, thereby enabling the LZ4 hash calculator 460*b* to read and calculate the raw data of the lookahead buffer 450*a*, and control the DEMUX 420*b* to connect the LZ4 hash calculator 460*b* to the hash comparator 465, thereby enabling the hash comparator 465 to obtain hash values generated by the LZ4 hash calculator 460*b*. Moreover, the configuration logic 240 may control the MUX 430*a* to connect the longest-prefix string matcher 470 to the LZ4 encoder 480*b*, thereby enabling the LZ4 encoder 480*b* to obtain raw strings or matched offsets with matched lengths output from the longest-prefix string matcher 470 and accordingly encode the raw data of the lookahead buffer 450*a* into compressed data in the LZ4 format. Those skilled in the art may realize the LZ4 encoder 480*b* for generating compressed data in the LZ4 format by referring to the well-known LZ4/LZ4 HC format and its encoding methods. The configuration logic 240 may control the MUX 440*a* to connect the lookahead buffer 450*a* to the fast hash encoder 490*c*, thereby enabling the fast hash encoder 490*c* to generate checksum values according to the raw data of the lookahead buffer 450*a*, and control the DEMUX 440*b* to connect the fast hash encoder 490*c* to the checksum buffer 450*c*. The configuration logic 240 may transmit the configuration settings that contain, for example, the compression level, the dictionary size "WS1", the hash table size "TS1", the output format "O1", the minimum-matched length "Min1", the maximum-matched length "Max1", the hash algorithm "H1" or "H2", etc., read from the compression parameter table 241 to the LZ4 hash calculator 460*b*, the hash comparator 465, the longest-prefix string matcher 470 and the LZ4 encoder 480*b*.

The following describes a scenario operated by the configuration logic 240 when the algorithm type of the input parameters 410 is LZO. The configuration logic 240 may control the MUX 420*a* to connect the lookahead buffer 450*a* to the LZO hash calculator 460*c*, thereby enabling the LZO hash calculator 460*c* to read and calculate the raw data of the lookahead buffer 450*a*, and control the DEMUX 420*b* to connect the LZO hash calculator 460*c* to the hash comparator 465, thereby enabling the hash comparator 465 to obtain hash values generated by the LZO hash calculator 460*c*. Moreover, the configuration logic 240 may control the MUX 430*a* to connect the longest-prefix string matcher 470 to the LZO encoder 480*c*, thereby enabling the LZO encoder 480*c* to obtain raw strings or matched offsets with matched lengths output from the longest-prefix string matcher 470 and accordingly encode the raw data of the lookahead buffer 450*a* into compressed data in the LZO format. Those skilled in the art may realize the LZO encoder 480*c* for generating compressed data in the LZO format by referring to the well-known LZO1X-1 format and its encoding methods. The configuration logic 240 may transmit the configuration settings that contain, for example, the compression level, the dictionary size "WS1", the hash table size "TS1", the output format "O1", the minimum-matched length "Min1", the maximum-matched length "Max1", the hash algorithm "H2", etc., read from the compression parameter table 241 to the LZO hash calculator 460*c*, the hash comparator 465, the longest-prefix string matcher 470 and the LZO encoder 480*c*. The configuration logic 240 may control the MUX 440*a* to connect the lookahead buffer 450*a* to the CRC encoder 490*a* or the Alder32 encoder 490*b* according to the checksum type of the input parameters 410, thereby enabling the connected checksum encoder to generate checksum values according to the raw data of the lookahead buffer 450*a*, and control the DEMUX 440*b* to connect the designated checksum encoder 490*a* or 490*b* to the checksum buffer 450*c* according to the checksum type of the input parameters. For example, when the input parameters 410 indicate that the algorithm type is LZO, the LZO hash calculator 460*c* reads the raw data of 4 bytes from the lookahead buffer 450*a* and uses the hash algorithm "H3" on the read data, and the hash comparator 465 traverses and updates a hash table by using the hash values obtained from the LZO hash calculator 460*c*. Subsequently, the longest-prefix string matcher 470 uses a match algorithm to calculate a longest-match length between raw strings of the sliding window (i.e. a dictionary) and the lookahead buffer 450*a*. If a match is presented, the longest-prefix string matcher 470 outputs a matched offset and a matched length to the LZO encoder 480*c* and move the sliding window of the data prefetcher 475 forward by the matched length of bytes via the shifter 473. If a match is absent, the longest-prefix string matcher 470 outputs the raw string to the LZO encoder 480*c* and move the sliding window of the data prefetcher 475 forward by 1 byte via the shifter 473.

The following describes a scenario operated by the configuration logic 240 when the algorithm type of the input parameters 410 is LZS. The configuration logic 240 may control the MUX 420*a* to connect the lookahead buffer 450*a* to the LZS hash calculator 460*d*, thereby enabling the LZS hash calculator 460*d* to read and calculate the raw data of the lookahead buffer 450*a*, and control the DEMUX 420*b* to connect the LZS hash calculator 460*d* to the hash comparator 465, thereby enabling the hash comparator 465 to obtain hash values generated by the LZS hash calculator 460*d*. Moreover, the configuration logic 240 may control the MUX 430*a* to connect the longest-prefix string matcher 470 to the LZS encoder 480*d*, thereby enabling the LZS encoder 480*d* to obtain raw strings or matched offsets with matched lengths output from the longest-prefix string matcher 470 and accordingly encode the raw data of the lookahead buffer 450*a* into compressed data in the LZS format. The configuration logic 240 may transmit the configuration settings that contain, for example, the dictionary size "WS3", the hash table size "TS3", the output format "O3", the minimum-matched length "Min3", the maximum-matched length "Max3", the hash algorithm "H4", etc., read from the compression parameter table 241 to the LZS hash calculator 460*d*, the hash comparator 465, the longest-prefix string matcher 470 and the LZS encoder 480*d*.

With the architecture of the aforementioned compression accelerator illustrated in the embodiments of the invention, compression algorithms of different types can reuse at least portions of hardware, such as the data prefetcher 475, the lookahead buffer 450*a*, the hash comparator 465, the longest-prefix string matcher 470, the shifter 473 and the compressed-data buffer 450*b* etc., to compress the raw data of the data prefetcher 475, instead of providing multiple compression accelerators for different algorithm types, resulting in a microprocessor with a smaller circuit size.

Figure 5:
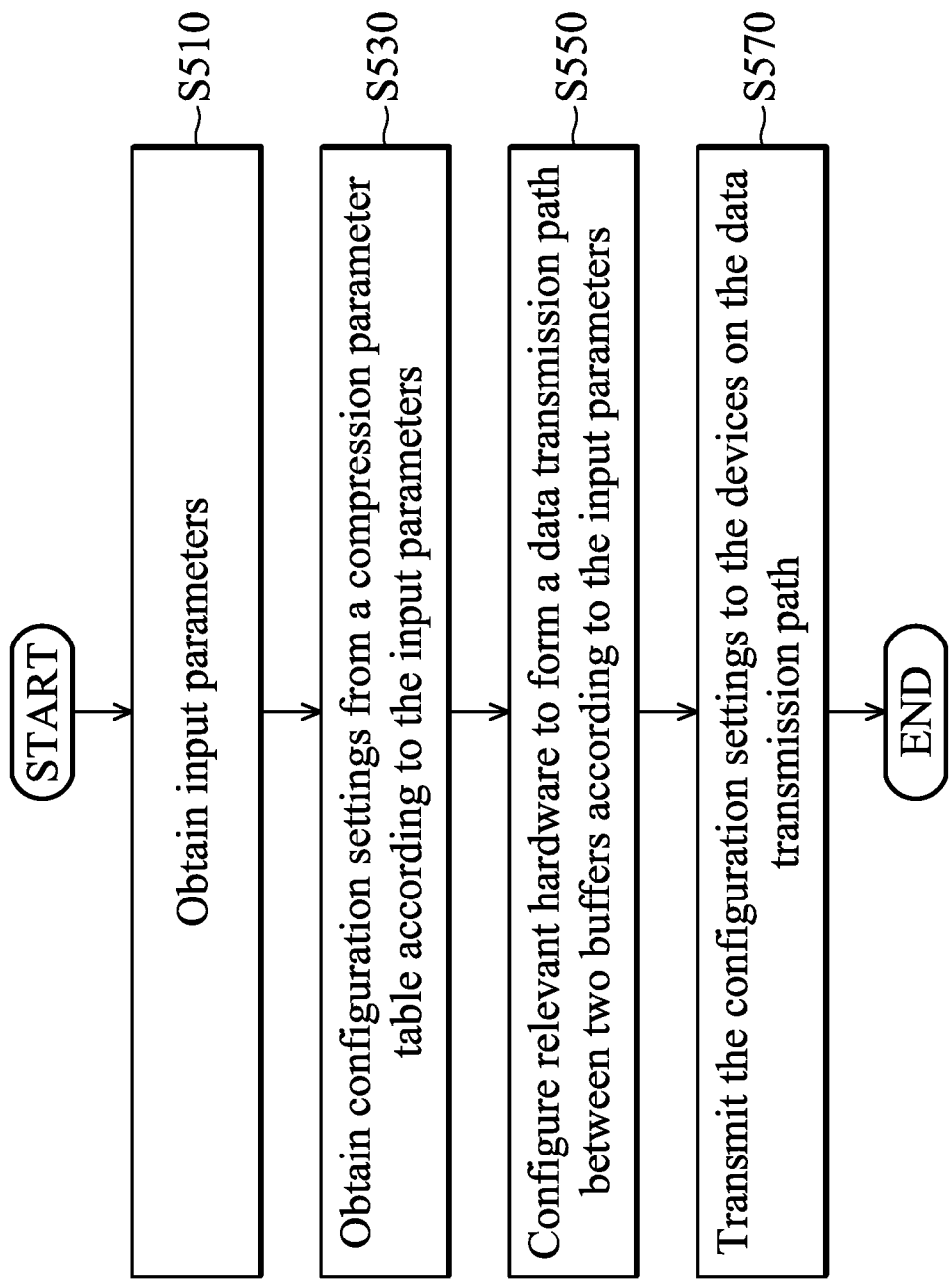
FIG. 5 is a flowchart of a method for accelerating compression, performed by a configuration logic, according to an embodiment of the invention.

FIG. 5 is a flowchart of a method for accelerating compression, performed by the configuration logic 240, according to an embodiment of the invention. The method begins to obtain the input parameters 410 from the processor core 170_1 (step S510), obtains configuration settings from the compression parameter table 241 according to the input parameters 410 (step S530), configures relevant hardware to form a data transmission path between two buffers (such as, between the lookahead buffer 450*a* and the compressed-data buffer 450*b*, or between the lookahead buffer 450*a* and the checksum buffer 450*c*) according to the input parameters 410 (step S550), and transmits the configuration settings to the devices on the data transmission path (step S570), thereby enabling the devices on the data transmission path to coordinate with each other to process the raw data of the lookahead buffer 450*a*, generate results for the designated algorithm type or checksum type indicated by the input parameters 410, and store the results in the corresponding buffer: either the compressed-data buffer 450*b* or the checksum buffer 450*c*.

As to a configuration of the data transmission path between two buffers in step S550, the input parameters 410 may contain an algorithm type and the two buffers contain the lookahead buffer 450*a* and the compressed-data buffer 450*b*. The whole data transmission path may be segmented into three sub-paths: a hash calculation, a longest-prefix string match and an encoding. The hash calculation sub-path contains the MUX 420*a*, the hash calculators 460*a*-460*d*, the DEMUX 420*b* and the hash comparator 465, the longest-prefix string match sub-path contains the longest-prefix string matcher 470, and the encoding sub-path contains the MUX 430*a*, the compression encoders 480*a*-480*d* and the DEMUX 430*b*. The configuration logic 240 may configure relevant devices to form the hash calculation sub-path according to the algorithm type. Specifically, the configuration logic 240 control the MUX 420*a* to connect the lookahead buffer 450*a* to the designated hash calculator 460*a*-460*d* and controls the DEMUX 420*b* to connect the designated hash calculator to the hash comparator 465. The configuration logic 240 may configure relevant devices to form the encoding sub-path according to the algorithm type. Specifically, the configuration logic 240 control the MUX 430*a* to connect the longest-prefix string matcher 470 to the designated compression encoder 480*a*-480*d* and controls the DEMUX 420*b* to connect the designated compression encoder to the compressed-data buffer 450*b*. The hash calculators 460*a*-460*d* use different algorithms to map strings (raw data) of the lookahead buffer 450*a* into hash values in fewer bits.

As to a configuration of the data transmission path between two buffers in step S550, the input parameters 410 may contain a checksum type and the two buffers contain the lookahead buffer 450*a* and the checksum buffer 450*c*. The whole data transmission path contains the MUX 440*a*, the checksum encoders 490*a*-490*d* and the DEMUX 440*b*. The configuration logic 240 may configure relevant devices to form the data transmission path according to the checksum type. Specifically, the configuration logic 240 control the MUX 440a to connect the lookahead buffer 450a to the designated checksum encoder 490a-490d and controls the DEMUX 440b to connect the designated checksum encoder to the checksum buffer 450c. The checksum encoders 490a-490d use different algorithms to generate checksum values according to the raw data of the lookahead buffer 450a.

Although the embodiments have been described as having specific elements in FIGS. 1, 2 and 4, it should be noted that additional elements may be included to achieve better performance without departing from the spirit of the invention. While the process flow described in FIG. 5 includes a number of operations that appear to occur in a specific order, it should be apparent that those skilled in the art can modify the order to achieve the same objectives. Thus, the invention should not be limited to the specific order.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for accelerating compression, performed by a configuration logic of a compression accelerator, comprising:
    obtaining an input parameter from a processor core;
    obtaining a configuration setting from a compression parameter table according to the input parameter;
    configuring components coupled between a first buffer and a second buffer to form a data transmission path according to the input parameter, wherein the first buffer stores raw data; and
    transmitting the configuration setting to the components on the data transmission path for processing the raw data to generate compressed data and storing the compressed data in the second buffer;
    wherein the compression parameter table is comprised within the configuration logic, and wherein the compression parameter table comprises a plurality of records and each record stores configuration settings associated with an algorithm type with a compression level;
    wherein the configuration settings comprise information indicating a dictionary size, a hash table size, an output format, a minimum-matched length, a maximum-matched length, a checksum type, and a hash algorithm.

2. The method of claim 1, wherein the input parameter comprises an algorithm type, the data transmission path comprises a hash calculation sub-path and an encoding sub-path, and the step for configuring the components coupled between the first buffer and the second buffer to form the data transmission path according to the input parameter comprises:
    configuring the hash calculation sub-path to connect the first buffer to a designated hash calculator, which is one of a plurality of hash calculators, and connect the designated hash calculator to a hash comparator according to the algorithm type; and
    configuring the encoding sub-path to connect a longest-prefix string matcher to a designated compression encoder, which is one of plurality of compression encoders, and connect the designated compression encoder to the second buffer.

3. The method of claim 2, wherein the hash calculators use different algorithms to map the raw data of the first buffer into hash values in fewer bits, and the hash comparator traverses and updates a hash table by using the hash values obtained from the designated hash calculator.

4. The method of claim 2, wherein the longest-prefix string matcher uses a match algorithm to calculate a longest-match length of strings between a sliding window of the first buffer and the raw data, and the designated compression encoder encodes the raw data of the first buffer into the compressed data to conform to the algorithm type according to a raw string or a matched offset with a matched length output from the longest-prefix string matcher.

5. The method of claim 1, wherein the input parameter comprises a checksum type, and the step for configuring the components coupled between the first buffer and the second buffer to form the data transmission path according to the input parameter comprises:
    configuring the components to connect the first buffer to a designated checksum encoder, which is one of plurality of checksum encoders, and connect the designated checksum encoder to the second buffer.

6. The method of claim 5, wherein the checksum encoders use different algorithms to generate checksum values according to the raw data of the first buffer.

7. The method of claim 1, wherein the input parameter is added into a file header of a compressed file by the processor core.

8. An apparatus for accelerating compression, comprising:
    a first buffer, storing raw data;
    a second buffer; and
    a configuration logic, obtaining an input parameter from a processor core; obtaining a configuration setting from a compression parameter table according to the input parameter;
    configuring components coupled between the first buffer and the second buffer to form a data transmission path according to the input parameter, wherein the first buffer stores raw data; and transmitting the configuration setting to the components on the data transmission path for processing the raw data to generate compressed data and storing the compressed data in the second buffer;
    wherein the compression parameter table is comprised within the configuration logic, and wherein the compression parameter table comprises a plurality of records and each record stores configuration settings associated with an algorithm type with a compression level;
    wherein the configuration settings comprise information indicating a dictionary size, a hash table size, an output format, a minimum-matched length, a maximum-matched length, a checksum type, and a hash algorithm.

9. The apparatus of claim 8, wherein the input parameter comprises an algorithm type, the data transmission path comprises a hash calculation sub-path comprising a plurality of hash calculators, and the configuration logic configure the hash calculation sub-path to connect the first buffer to the designated hash calculator and connect the designated hash calculator to a hash comparator according to the algorithm type.

10. The apparatus of claim 9, wherein the hash calculation sub-path comprises a MUX (multiplexer) and a DEMUX (de-multiplexer), the configuration logic control the MUX of the hash calculation sub-path to connect the first buffer to the designated hash calculator and control the DEMUX of the hash calculation sub-path to connect the designated hash calculator to the hash comparator.

11. The apparatus of claim 9, wherein the hash calculators use different algorithms to map the raw data of the first buffer into hash values in fewer bits, and the hash comparator traverses and updates a hash table by using the hash values obtained from the designated hash calculator.

12. The apparatus of claim 8, wherein the input parameter comprises an algorithm type, the data transmission path comprises a encoding sub-path comprising a plurality of compression encoders, and the configuration logic configure the encoding sub-path to connect a longest-prefix string matcher to the designated compression encoder and connect the designated compression encoder to the second buffer according to the algorithm type.

13. The apparatus of claim 12, wherein the encoding sub-path comprises a MUX (multiplexer) and a DEMUX (de-multiplexer), the configuration logic control the MUX of the encoding sub-path to connect the longest-prefix string matcher to the designated compression encoder and control the DEMUX of the encoding sub-path to connect the designated compression encoder to the second buffer.

14. The apparatus of claim 12, wherein the longest-prefix string matcher uses a match algorithm to calculate a longest-match length of strings between a sliding window of the first buffer and the raw data, and the designated compression encoder encodes the raw data of the first buffer into the compressed data to conform to the algorithm type according to a raw string or a matched offset with a matched length output from the longest-prefix string matcher.

15. The apparatus of claim 8, wherein the input parameter comprises a checksum type, the data transmission path comprises a plurality of checksum encoders, and the configuration logic configure the data transmission path to connect the first buffer to the designated checksum encoder and connect the designated checksum encoder to the second buffer according to the checksum type.

16. The apparatus of claim 15, wherein the data transmission path comprises a MUX (multiplexer) and a DEMUX (de-multiplexer), the configuration logic control the MUX of the data transmission path to connect the first buffer to the designated checksum encoder and control the DEMUX of the data transmission path to connect the designated checksum encoder to the second buffer.

17. The apparatus of claim 15, wherein the checksum encoders use different algorithms to generate checksum values according to the raw data of the first buffer.

18. The apparatus of claim 8, wherein the input parameter comprises an algorithm type and a compression level, the configuration logic calculate a memory address according to the algorithm type with the compression level, read data of a predefined length from the memory address and parse the configuration setting from the data.

19. The apparatus of claim 8, wherein the first buffer, the second buffer, the data transmission path and the configuration logic are disposed in a compression accelerator and the compression accelerator is disposed outside of the processor core.

* * * * *